United States Patent [19]

Watanabe et al.

[11] Patent Number: 5,104,834

[45] Date of Patent: Apr. 14, 1992

[54] DIELECTRIC CERAMICS FOR ELECTROSTATIC CHUCKS AND METHOD OF MAKING THEM

[75] Inventors: Toshiya Watanabe; Tetsuo Kitabayashi; Chiaki Nakayama, all of Chigasaki-shi Kanagawa, Japan

[73] Assignee: Tot Ltd., Kita-kyusyu, Japan

[21] Appl. No.: 343,805

[22] Filed: Apr. 26, 1989

[30] Foreign Application Priority Data

Apr. 26, 1988 [JP] Japan .................................. 63-104844

[51] Int. Cl.$^5$ ............................................. C04B 35/10
[52] U.S. Cl. ..................................... 501/127; 501/135; 501/153
[58] Field of Search .................. 501/127, 135, 153; 264/65

[56] References Cited

U.S. PATENT DOCUMENTS

| | | | |
|---|---|---|---|
| 4,020,234 | 4/1977 | Gardner | 501/154 |
| 4,109,377 | 8/1978 | Blazick et al. | 264/65 |
| 4,591,574 | 5/1986 | Ando et al. | 501/136 |
| 4,668,644 | 5/1987 | Fuhol | 501/153 |
| 4,678,683 | 7/1987 | Pasco et al. | 501/96 |
| 4,735,926 | 4/1988 | Ando et al. | 501/127 |

FOREIGN PATENT DOCUMENTS

| | | |
|---|---|---|
| 2520930 | 8/1983 | France . |
| WO88/03917 | 6/1988 | PCT Int'l Appl. . |

OTHER PUBLICATIONS

Chem. Abstract of Japanese Patent 79-32450, dated Oct. 15, 1979.
Japanese Unexamined Patent Application No. 94953, published May 1, 1987.
Chemical Abstracts, vol. 92, No. 6, Feb. 1, 1980, p. 270.
Patent Abstracts of Japan, vol. 11, No. 294, (E-544), [2741], Sep. 22, 1987.

*Primary Examiner*—William R. Dixon, Jr.
*Assistant Examiner*—Carol Bonner
*Attorney, Agent, or Firm*—Merchant, Gould, Smith, Edell, Welter & Schmidt

[57] ABSTRACT

A dielectric ceramic for use in an electrostatic chuck, formed by firing in a reducing atmosphere a ceramic material mainly comprised of alumina, wherein said ceramic material comprises an alkaline earth metal in an amount of from 1.0 to 6.0% by weight in terms of oxide and a transition metal in an amount of from 0.5 to 6.0% by weight in terms of oxide, while controlling the dew point of atmosphere gas to be not more than 45° C.

Also disclosed is a method of making a dielectric ceramic for use in an electrostatic chuck, comprising firing a ceramic material mainly comprised of alumina and containing from 1.0 to 6.0% by weight of an alkaline earth metal in terms of oxide and from 0.5 to 6.0% by weight of a transition metal in terms of oxide, in a reducing atmosphere while controlling the dew point of atmosphere gas.

6 Claims, 2 Drawing Sheets

DIELECTRIC CERAMICS FOR ELECTROSTATIC CHUCKS AND METHOD OF MAKING THEM

BACKGROUND OF THE INVENTION

1. Field of the Invention

The present invention relates to dielectric ceramics suited for electrostatic chucks used to fix semiconductor wafers, correct flatness thereof or carry them in etching apparatus, CVD apparatus, electron beam exposure apparatus, light exposure apparatus, etc.

2. Description of Related Art

Japanese Unexamined Patent Publication No. 94953/1987 discloses an electrostatic chuck prepared by firing alumina containing a certain transition metal oxide, in a reducing atmosphere.

The above electrostatic chuck, however, has a dielectric constant $\epsilon$ of from 9 to 10 at best, and requires application of a high voltage (about 400 V) in producing a given attracting force. Hence, it has been desired to provide dielectric ceramics for electrostatic chucks that have a higher dielectric constant and can produce a given attracting force with application of a lower voltage.

If the sole objective is to increase the dielectric constant, dielectric materials such as $BaTiO_3$ may be used. However, materials for this kind all have a smaller mechanical strength than alumina, disadvantageously.

SUMMARY OF THE INVENTION

The present invention provides a dielectric ceramic for use in electrostatic chucks, obtained by firing in a reducing atmosphere a ceramic material mainly comprised of alumina, wherein an alkaline earth metal and a transition metal such as titanium are added in said ceramic material in amounts of from 1.0 to 6.0% by weight and from 0.5 to 6.0% by weight, respectively, in terms of oxides.

The present invention also provides a method of making a dielectric ceramic for use in electrostatic chucks, comprising firing a ceramic material mainly comprised of alumina and containing 1.0 to 6.0% by weight of an alkaline earth metal in terms of oxide and from 0.5 to 6.0% by weight of a transition metal in terms of oxide, in a reducing atmosphere while controlling the dew point of atmosphere gas.

Here, the ceramic material may optionally contain a sintering aid such as silica.

The alkaline earth metal may be used in the form of an oxide such as calcia or magnesia and a carbonate such as calcium carbonate or calcium magnesium.

As to also the transition metal such as titanium, it may be used similarly in the form of an oxide or carbonate thereof, as well as a double oxide such as aluminum titanate.

The above dielectric ceramic for electrostatic chucks is mainly constituted of alumina particles and a small quantity of transition metal compound (a double oxide comprising a transition metal oxide and an alkaline earth metal oxide) present between the particles, and can have a high dielectric constant, also securing a sufficient mechanical strength.

The dielectric constant is increased presumably because the presence of the transition metal compounds such as titanate between the alumina particles and also the firing in a reducing atmosphere bring part of the transition metal compounds into non-stoichiometric compounds, and as a result bring about non-uniformity in resistance values in the structure, resulting in presence of minute capacitors in a large number.

The dielectric ceramics for electrostatic chucks according to the present invention can also obtain sufficient mechanical strength since the additional components do not impair the mechanical properties of the main component alumina.

The above and other characteristic features and merits of the present invention will become apparent from the detailed description of the preferred embodiments, set out below with reference to the accompanying drawing.

DESCRIPTION OF THE PREFERRED EMBODIMENTS

Figure 1:
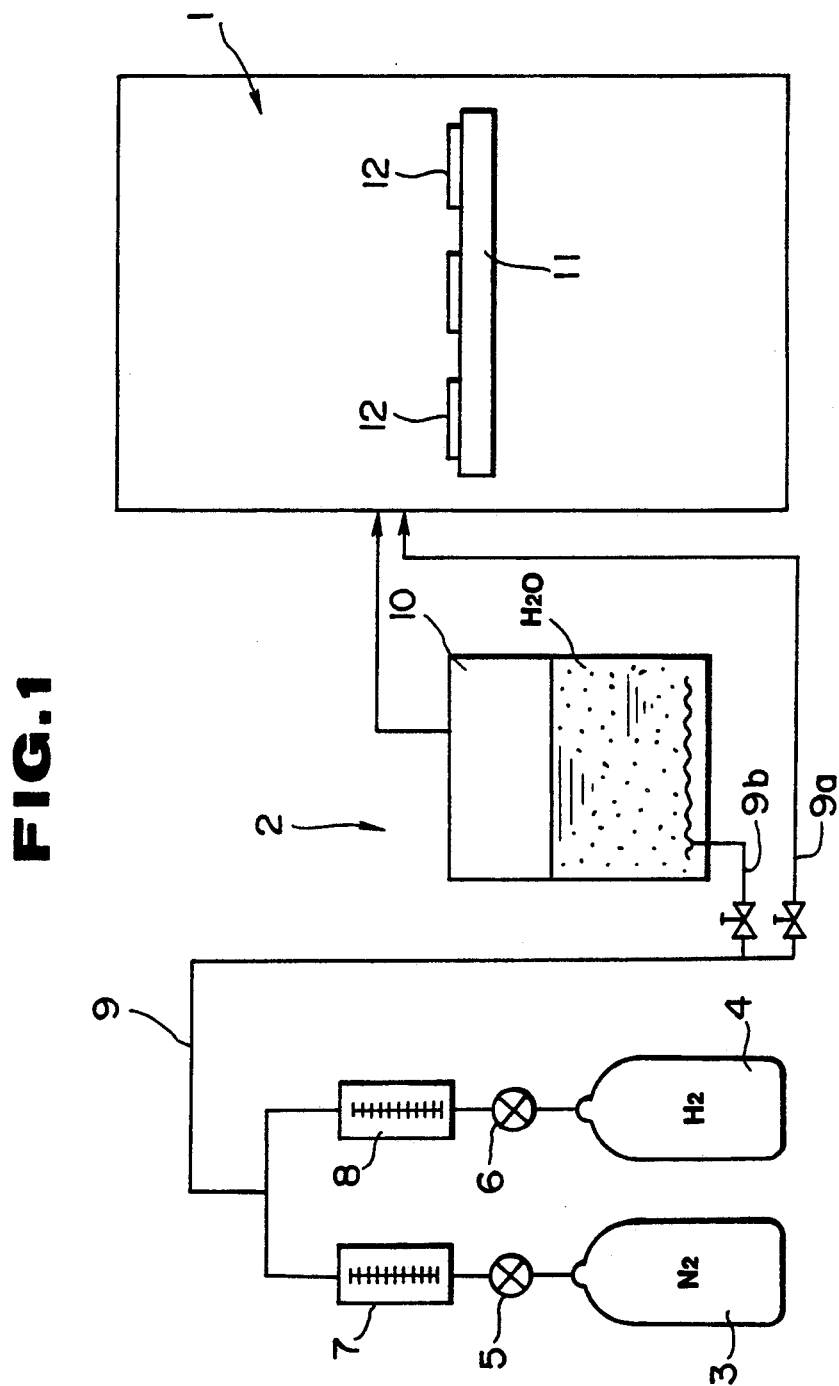
FIG. 1 is a diagramatical illustration of a firing apparatus to carry out the method of the present invention.

In molding the dielectric ceramics of the present invention, the additives added for the purpose of making the transition metal compounds lie between the alumina particles are an alkaline earth metal and a transition metal.

The alkaline earth metal may be arbitrarily selected from oxides or carbonates of Ca, Mg, Sr, Ba, etc., and at least one of these is added in an amount of about from 1.0 to 6.0% by weight in terms of oxide. The transition metal may also include Fe and Pb in addition to Ti, and any of these is added in an amount of about from 0.5 to 6.0% by weight in terms of oxide.

An amount of less than 1.0% by weight in terms of oxide, of the alkaline earth metal material added in the alumina material, can not achieve the effect of its addition, and on the other hand an amount more than 6.0% by weight may result in the formation of a liquid phase at low temperatures to make it impossible to carry out sufficient firing. Also, an amount less than 0.5% by weight in terms of oxide, of the transition metal added in the alumina material, can not achieve the effect of its addition, and on the other hand an amount more than 6.0% by weight may result in the formation of a liquid phase at low temperatures to make it impossible to carry out sufficient firing.

In this method, the alkaline earth metal and transition metal are mixed together with alumina and a sintering aid such as $SiO_2$ when a green sheet is molded, and they react by the firing in a reducing atmosphere to produce the transition metal compound. Here, the titanate as the transition metal compound includes $CaTiO_3$, $MgTiO_3$, $SrTiO_3$ and $BaTiO_3$. These transition metal compounds are mixed into the glass phases between alumina particles, with loss of oxygen in an inconstant proportion, and have functions to increase the dielectric constant and lower the insulation resistance.

The amounts in terms of oxide, of the alkaline earth metal and transition metal to be added are prescribed as above for the reason that amounts less than the above proportions can not achieve the effect of their addition, and amounts more than the above proportions bring about formation of the transition metal compounds in proportional amounts, but results in a lowering of the mechanical strength as an alumina ceramic material.

The firing in a reducing atmosphere, which is main firing for obtaining a dense sinter, is carried out at from 1,500° to 1,650° C. (generally about 1,600° C.) for from 1 to 7 hours (generally about 2 hours). In the present invention, the controlling of the dew point of atmosphere gas at this stage is greatly concerned with the volume specific resistance of the resulting ceramics.

Experimental examples of the present invention will be described below.

Prescribed amounts of $SiO_2$, CaO, MgO, SrO, BaO and $TiO_2$ were weighed as shown by wt. % in Table 1 for Samples 2 to 7, and mixed and ground using a ball mill. After a binder as well as toluene, butyl acetate and so forth were added, the resulting mixture was deaerated and aged, and thereafter molded into green sheets. The resulting green sheets were laminated on substrates which were similarly formed into green sheets and on the surfaces of which electrode layers comprising tungsten, molybdenum or the like were printed, followed by firing at 1,600° C. in a reducing atmosphere, setting the dew point (d.p.) of atmosphere gas to 30° C.

FIG. 1 is a diagramatical illustration of a firing apparatus to carry out the method of the present invention, wherein the firing apparatus comprises a furnace 1 and a feeding unit 2 for feeding atmosphere gas into this furnace 1. The feeding unit comprises a nitrogen gas tank 3 and a hydrogen gas bomb 4, and the nitrogen gas and hydrogen gas contained therein are joined through valves 5 and 6 and flowmeters 7 and 8, respectively, and directly fed into the furnace 1 through a pipe 9a as atmosphere gas, or alternatively fed into a water tank 10 through a pipe 9b, where the nitrogen gas $N_2$, hydrogen gas $H_2$ and water vapor $H_2O$ are bubbled, which are then fed into the furnace 1 as atmosphere gas. Here, the water tank 10 is equipped with a heater. Under such construction, in the instance where the hydrogen gas and nitrogen gas are fed into the furnace 1 through the water tank 10, the dew point (d.p.) of the atmosphere gas fed into the furnace 1 can be maintained at a given temperature by controlling the water temperature in the water tank 10. Thus, the water vapor contained in the atmosphere gas, or the oxygen partial pressure in the atmosphere gas, is controlled.

Table 2 shows comparisons on the properties (dielectric constant, insulation resistance, presence of transition metal compound, attracting force, and mechanical strength) for each compositional example of Samples 2 to 7 and the prior art in Table 1.

As is seen from Table 2, with increase in the amount of $TiO_2$, the transition metal compound deposits inside the ceramics, and concurrently the dielectric constant becomes higher by the factor of from 1.5 times to 15.5 times the prior art and the attracting force also increases by the factor of from 40 times to 62.5 times. Also, the insulation resistance is lowered to the range from $10^{12}$ $\Omega \cdot cm$ to $10^8$ $\Omega \cdot cm$ in inverse proportion to the increase in the amount of $TiO_2$, and this tells that a larger amount of volume charge is produced inside the insulating film, and also the surface charge, on the surface of the insulating film, bringing about an increase in the attracting force. The mechanical strength became slightly smaller, but not to the level that any difficulty arises.

Next, a method of controlling the insulation resistance $\rho$ will be described below, which is useful in minimizing the residual electrostatic force to improve response.

To remove the residual electrostatic force in the insulating film, the insulation resistance may be lowered to obtain effect, but an excessively lowered insulation resistance may undesirably result in a great consumption of electric power, and thus its value should be controlled to approximately from $10^8$ $\Omega \cdot cm$ to $10^{13}$ $\Omega \cdot cm$, for example, approximately from $10^{10}$ $\Omega \cdot cm$ to $10^{13}$ $\Omega \cdot cm$ at room temperature when the electrostatic chuck is used at temperatures of from $-50°$ to 200° C., which are suitable values taking account of economical reasons. In order to obtain this insulation resistance value, the presence of water vapor or the dew point (d.p.) of atmosphere gas may be controlled when the firing in a reducing atmosphere is carried out. The dew point (d.p.) of atmosphere gas may be controlled to be not more than 45° C.

Table 3 shows the compositional example of ceramics of $Al_2O_3$-$SiO_2$-(CaO, MgO, SrO, BaO)-$TiO_2$ system, the firing conditions, and the insulation resistance $\rho$ obtained, for each Sample 8 to 11.

Figure 2:
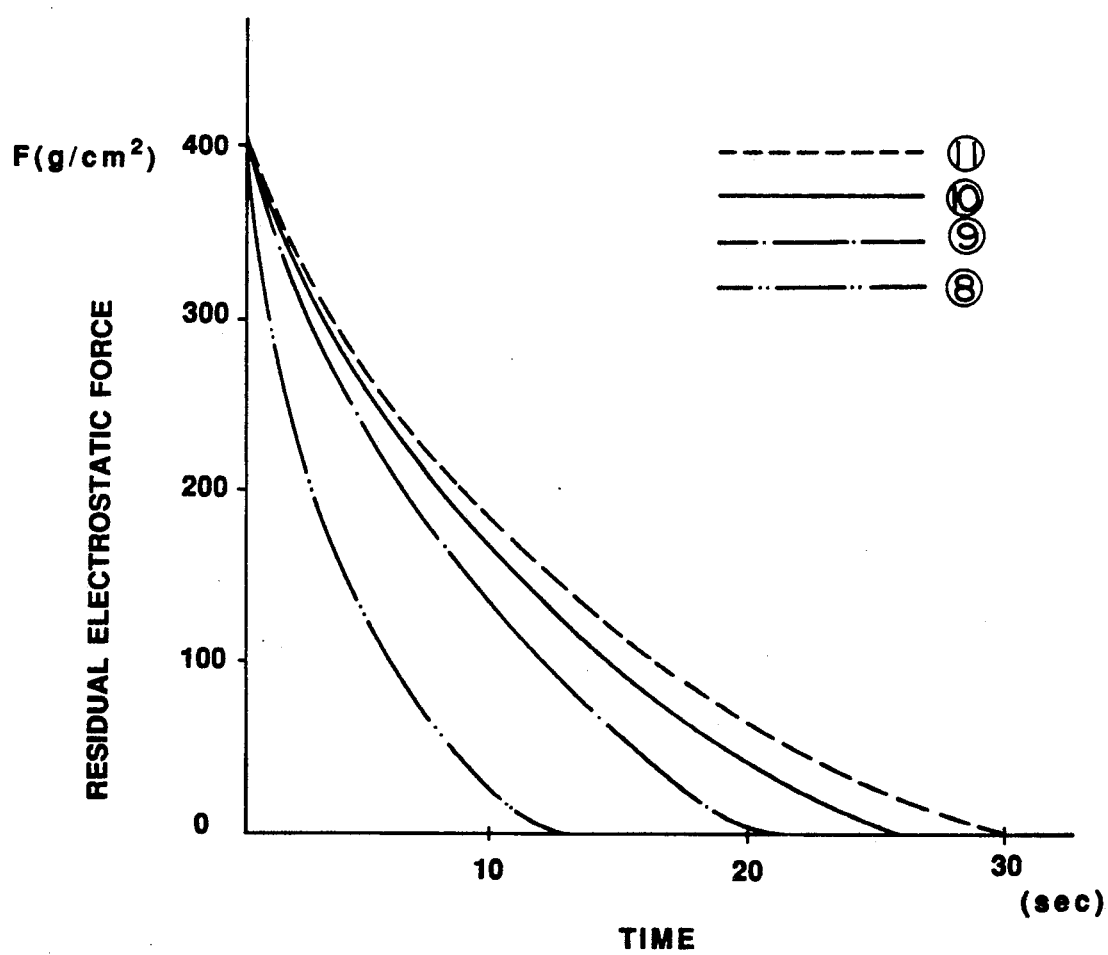
FIG. 2 is a graph to show the magnitude of residual electrostatic force of each sample 8, 9, 10 and 11 of Table 3 shown herein, and the time having lapsed until it disappeared.

As shown in FIG. 2, the time taken for the removal of residual electrostatic force becomes shorter with decrease in the dew point (d.p.) of atmosphere gas when the firing in a reducing atmosphere is carried out, as in Sample 11, 10, 9 to 8. In particular, Sample 8 showed the feature that the time taken for the removal of residual electrostatic force (400 g/cm$^2$) was as extremely short as 13 seconds.

Also, the decrease in residual electrostatic force is promoted by the lowering of insulation resistance $\rho$, and it is presumed that the disappearance rate of the remaining volume charge and surface charge is accelerated in inverse proportion to the lowering of insulation resistance $\rho$.

The molded products prepared by the green sheet lamination method contain binders in large amounts, so that the binders may not be removed at an excessively low dew point of atmosphere gas and the resulting fired products may not be made dense. Accordingly, in the present invention, here may be employed a method in which calcination (preliminary firing) is once carried out under conditions of a dew point of 45° C. to thoroughly remove the binders, and thereafter, sintering (i.e., the main firing, or the firing in a reducing atmosphere) is carried out at a higher temperature while controlling the dew point to control the insulation resistance value.

The preliminary firing, if employed may be carried out at from 500° to 1,200° C. (generally about 1,200° C.) for about 1 hour to about 2 hours.

Table 4 shows the compositional examples and firing conditions in the examples in which the insulation resistance $\rho$ was further lowered by using the method of controlling the dew point of atmosphere gas when the firing in a reducing atmosphere is carried out.

In the instance where this controlling method is used, there is the advantage that the dielectric ceramics with a small residual electrostatic force can be obtained, and it is unnecessary to apply any operation or special processing to eliminate the residual electrostatic force by applying reverse voltage or alternating current, or make small the residual electrostatic force by decreasing volume components by applying slit processing.

The present invention is constituted as described above, thus having the following advantages.

Because of the dielectric constant increased to about 1.5 times to 15 times as compared with the prior art, the substrates can be stably attracted and held under application of a low voltage, so that the product of the present invention is not only economical but also free from any possibility of bringing about insulation failure when a semiconductor device is attracted thereto, and of course the insulating film of the electrostatic chuck can be broken with difficulty, securing safety, and shows mechanical strength with values similar to those of alumina, thus totally promising improvement in reliability.

It is also possible to lower the insulation resistance to the level that the electrostatic force can be produced which is strong enough to carry non-magnetic materials such as wafers in the atmosphere or vacuum, and also to minimize the residual electrostatic force, so that the present invention can contribute towards the improvement in the response.

TABLE 1

| Sample No. | $Al_2O_3$ (wt. %) | $SiO_2$ (wt. %) | CaO (wt. %) | MgO (wt. %) | SrO (wt. %) | BaO (wt. %) | $TiO_2$ (wt. %) |
|---|---|---|---|---|---|---|---|
| 1* | 93 | 5 | 1 | 1 | 0 | 0 | 0 |
| 2 | 93.5 | 5 | 1 | 0 | 0 | 0 | 0.5 |
| 2a | 93 | 5 | 0.5 | 0.5 | 0 | 0 | 1 |
| 3 | 89 | 4 | 2 | 2 | 0 | 0 | 3 |
| 4 | 88 | 5 | 2 | 0 | 2 | 0 | 3 |
| 5 | 88 | 5 | 0 | 0 | 2 | 2 | 3 |
| 6 | 88 | 4 | 2 | 2 | 0 | 0 | 4 |
| 7 | 86 | 2 | 3 | 3 | 0 | 0 | 6 |

*Prior art

TABLE 2

| Sample No. | Dielectric constant ε (1 KHz) | Insulation resistance ρ (Ω · cm) | Presence of titanate | F(g/cm²) (under appln. of 1 kV) | σ(kg/cm²) |
|---|---|---|---|---|---|
| 1* | 10 | $10^{14}$ | None | 20 | 3,200 |
| 2 | 15 | $10^{12}$ | Present | 800 | 2,800 |
| 2a | 15 | $10^{12}$ | Present | 1,000 | 2,800 |
| 3 | 90 | $10^{11}$ | Present | 1,000 | 2,800 |
| 4 | 93 | $10^{11}$ | Present | 1,250 | 2,800 |
| 5 | 101 | $10^{11}$ | Present | 1,250 | 2,800 |
| 6 | 150 | $10^{10}$ | Present | 1,250 | 2,500 |
| 7 | 155 | $10^{8}$ | Present | 1,200 | 2,000 |

*Prior art

TABLE 3

| Sample No. | Sample composition (wt. %) | | | | | d.p. at preliminary firing (°C.) | d.p. at main firing (°C.) | Insulation resistance (Ω · cm) |
|---|---|---|---|---|---|---|---|---|
| | $Al_2O_3$ | $SiO_2$ | CaO | MgO | $TiO_2$ | | | |
| 8 | 89 | 5 | 2 | 2 | 2 | 45 | None* | $2.0 \times 10^9$ |
| 9 | 89 | 5 | 2 | 2 | 2 | 45 | 15 | $5.1 \times 10^{10}$ |
| 10 | 89 | 5 | 2 | 2 | 2 | 45 | 30 | $1.2 \times 10^{11}$ |
| 11 | 89 | 5 | 2 | 2 | 2 | 45 | 45 | $6.3 \times 10^{12}$ |

*No water vapor was fed.

TABLE 4

| Sample No. | Sample composition (wt. %) | | | | | d.p. at preliminary firing (°C.) | d.p. at main firing (°C.) | Insulation resistance (Ω · cm) |
|---|---|---|---|---|---|---|---|---|
| | $Al_2O_3$ | $SiO_2$ | CaO | MgO | $TiO_2$ | | | |
| 12 | 89 | 4 | 2 | 2 | 3 | 45 | None* | $8.0 \times 10^8$ |
| 13 | 89 | 4 | 2 | 2 | 4 | 45 | None* | $5.4 \times 10^7$ |
| 14 | 89 | 4 | 2 | 2 | 5 | 45 | None* | $1.3 \times 10^6$ |
| 15 | 89 | 2 | 3 | 3 | 6 | 45 | 45 | $8.6 \times 10^5$ |

*No water vapor was fed.

We claim:

1. A dielectric ceramic material for use in an electrostatic chuck, formed by firing in a reducing atmosphere, while controlling the dew point of atmosphere gas, said dielectric ceramic material comprising alumina, an alkaline earth metal in an amount of from 1.0 to 6.0% by weight in terms of oxide, and a transition metal in an amount of from 0.5 to 6.0% by weight in terms of oxide, wherein said dielectric ceramic material has an insulation resistance of not more than $10^{12}$ Ωcm.

2. The dielectric ceramic material for use in an electrostatic chuck according to claim 1, wherein said transition metal comprises titanium.

3. The dielectric ceramic material for use in an electrostatic chuck according to claim 1, wherein said alkaline earth metal is at least one of Ca, Mg, Sr and Ba.

4. A dielectric ceramic material for an electrostatic chuck, formed by firing in a reducing atmosphere while controlling the dew point of the atmosphere gas, said dielectric ceramic material comprising a sintering aid, alumina, an alkaline earth metal in an amount of from 1.0 to 6.0% by weight in terms of oxide and a transition metal in an amount of from 0.5 to 6.0% by weight in terms of oxide, wherein said dielectric ceramic material has an insulation resistance of not more than $10^{12}$ Ωcm.

5. The dielectric ceramic material for an electrostatic chuck according to claim 4, wherein said transition metal comprises titanium.

6. The dielectric ceramic material in an electrostatic chuck according to claim 4, wherein said alkaline earth metal is at least one of Ca, Mg, Sr and Ba.

* * * * *

UNITED STATES PATENT AND TRADEMARK OFFICE
CERTIFICATE OF CORRECTION

PATENT NO. : 5,104,834
DATED : April 14, 1992
INVENTOR(S) : Toshiya Watanabe et al.

It is certified that error appears in the above-identified patent and that said Letters Patent is hereby corrected as shown below:

On the cover page, section [73], please delete "Tot" and insert therefor --TOTO--; and please delete "Kita-Kyusyu" and insert therefor --Kita-Kyusyu-shi--.

Signed and Sealed this

Twenty-first Day of December, 1993

*Attest:*

BRUCE LEHMAN

*Attesting Officer*     *Commissioner of Patents and Trademarks*